(12) United States Patent
Lee et al.

(10) Patent No.: US 7,911,001 B2
(45) Date of Patent: Mar. 22, 2011

(54) METHODS FOR FORMING SELF-ALIGNED DUAL STRESS LINERS FOR CMOS SEMICONDUCTOR DEVICES

(75) Inventors: Kyoung Woo Lee, Suwon-si (KR); Ja Hum Ku, Seongnam-si (KR); Taehoon Lee, Suwon-si (KR); Seung-Man Choi, Seongnam-si (KR); Thomas W. Dyer, Pleasant Valley, NY (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 232 days.

(21) Appl. No.: 11/778,045

(22) Filed: Jul. 15, 2007

(65) Prior Publication Data
US 2009/0014808 A1    Jan. 15, 2009

(51) Int. Cl.
*H01L 21/311* (2006.01)
*H01L 27/092* (2006.01)

(52) U.S. Cl. ......... 257/369; 257/E27.062; 257/E21.249; 438/699

(58) Field of Classification Search ................. 257/369
See application file for complete search history.

(56) References Cited

U.S. PATENT DOCUMENTS

| | | | | |
|---|---|---|---|---|
| 5,271,972 | A * | 12/1993 | Kwok et al. | 427/579 |
| 2006/0199326 | A1* | 9/2006 | Zhu et al. | 438/201 |
| 2007/0122982 | A1* | 5/2007 | Chan et al. | 438/275 |
| 2008/0150033 | A1* | 6/2008 | Greene et al. | 257/369 |
| 2008/0251851 | A1* | 10/2008 | Pan et al. | 257/369 |

\* cited by examiner

*Primary Examiner* — Jarrett J Stark
*Assistant Examiner* — Lawrence Tynes, Jr.
(74) *Attorney, Agent, or Firm* — F. Chau & Associates, LLC

(57) ABSTRACT

CMOS (complementary metal oxide semiconductor) fabrication techniques are provided to form DSL (dual stress liner) semiconductor devices having non-overlapping, self-aligned, dual stress liner structures.

13 Claims, 6 Drawing Sheets

US 7,911,001 B2

METHODS FOR FORMING SELF-ALIGNED DUAL STRESS LINERS FOR CMOS SEMICONDUCTOR DEVICES

TECHNICAL FIELD OF THE INVENTION

The present invention relates generally to CMOS (complementary metal oxide semiconductor) fabrication techniques to form DSL (dual stress liner) semiconductor devices and, in particular, fabrication methods for forming non-overlapping, self-aligned, dual stress liner structures for CMOS semiconductor devices.

BACKGROUND

In general, CMOS semiconductor devices include integrated circuits having complementary pairs of P-channel field-effect transistors and N-channel field-effect transistors formed on a common semiconductor substrate. As is generally known in the art, CMOS technologies are typically used to fabricate IC (integrated circuit) chips for high density and high-performance applications due to, e.g., the high operation efficiency, high switching speed, and good scaling properties that are characteristic of CMOS devices. Technological innovations in semiconductor fabrication technologies are driving market demands for CMOS solutions for higher speed, higher integration density, and lower power applications. The downscaling of CMOS technologies to submicron design rules and beyond, however, poses technological challenges with respect to maintaining performance and reliability. For example, as device sizes are downscaled, CMOS transistors must be formed with, e.g., thinner gate electrodes, smaller channel lengths, and shallower drain/source extension diffusion regions. This downscaling generally results in transistors having higher channel resistance and higher junction/contact parasitic resistances, leading to degraded performance.

To mitigate the impact on device performance with downscaling, various state of the art CMOS fabrication techniques can be implemented to effectively reduce parasitic gate and junction resistances and increase channel conductivity. For example, DSL (dual stress liner) techniques can be incorporated in CMOS process flows as a means to enhance performance of highly-scaled CMOS devices. In general, DSL technologies are premised on findings that the application of compressive stress to the conduction channel of a P-type transistor can improve the carrier (holes) mobility within the channel, while the application of tensile stress to the conduction channel of an N-type transistor can improve the carrier (electrons) mobility within the channel. In this regard, various DSL techniques have been developed to form a compressive stress insulating liner over the gate structure of P-type transistors while forming tensile stress insulating liners over the gate structures of N-type transistor devices, so as to increase charge carrier mobility in the channels of the complementary transistors.

FIG. 1 is a cross-sectional schematic view of a dual stress liner CMOS device having a conventional framework. FIG. 1 illustrates a CMOS semiconductor device (100) having NMOS and PMOS transistor structures (110) and (120) formed in respective active regions (102) and (103) on an active surface of a semiconductor substrate (101). The active regions (102) and (103) are defined and separated by an isolation structure (104) (e.g., STI (shallow trench isolation) structure). In the illustrative embodiment, the active region (102) is defined by a portion of a P-type substrate layer (101a) and the active region (103) comprises an N-type device well (101b) formed in the P-type substrate layer (101a). The NMOS transistor (110) comprises a gate structure (111) formed on the substrate surface in the active region (102), as well as n-doped drain/source diffusion regions (16) formed in the p-type substrate layer (101a). Similarly, the PMOS transistor (120) comprises a gate structure (121) formed on the substrate surface in the active region (103), as well as p-doped drain/source diffusion regions (16) formed in the N-well (101b). The source/drain regions (16) of the transistors (110) and (120) include metal silicide contact regions (17).

The gate structures (111) and (121) have similar structures, each comprising a polysilicon (poly-Si) gate electrode (11/12/13) formed of stacked layers including a dielectric layer (11), a polysilicon layer (12) and a metal silicide layer (13). Moreover, the gate structures (111) and (121) each have thin L-shaped sidewall insulating spacer layers (14) formed on the sidewalls of the gate electrodes (11/12/13) and a portion of the surface of the active silicon regions adjacent the sidewalls. A polyconductor structure (131) is formed over the isolation region (104), which comprises a polysilicon layer (12') and metal silicide layer (13') similar to the gate structures (111) and (121). As is known in the art, the polyconductor structure (131) may be part of an electrical interconnection that is formed simultaneously and integrally with the gate structures (111) and (121), which serves to connect the gate electrodes of the complementary transistor pairs (110) and (120), for example.

Further, different stress liner layers (140, 160) are formed over the active surface of the semiconductor substrate (101) to form a DSL structure that imparts appropriate stresses to enhance the channel conductivity of the CMOS transistors (110) and (120). For such CMOS devices employing dual liners, a conventional approach has been to form the two different stress liner layers (140) and (160) using separate lithographic patterning steps. For example, the stress liner layer (140) and optional oxide film (150) can be formed by depositing a tensile silicon nitride film and oxide film over both PFET and NFET device regions, followed by a photolithographic patterning process to pattern the stress liner layer (140) and oxide layer (150) to remove the portions of the stress liner layer (140) and oxide layer (150) over the NFET device region (103). Thereafter, the stress liner layer (160) can be formed by depositing a compressive silicon nitride film over the NFET and PFET device regions (102) and (103), followed by a second photolithographic patterning process to pattern the stress liner layer (160) and remove the portions of the stress liner layer (160) and oxide layer (150) over the PFET device region (103). In this process, the stress liner layers (140) and (160) are formed using separate lithographic patterning steps.

Due to inherent limitations associated with aligning subsequent photolithographic levels to previous levels, the various DSL structure layers (140), (150) and (160) may be formed in a manner, such as depicted in FIG. 1, where the compressive stress liner (160) overlaps the tensile nitride liner (140) and oxide layer (150). This overlap ensures that no gap is formed between the two stress liner layers (140) and (160) due to misalignment of the two photolithographic processes. This conventional process results in a DSL structure having a non-uniform thickness. For example, in the illustrative embodiment of FIG. 1, the overlapping portion of the DSL structure has a thickness equal to the combined thickness $t_1$ of the first stress liner layer (140) and the thickness $t_2$ of the second stress liner layer (160), plus some smaller added thickness of the oxide layer (150). In this regard, the dual stress liner structure has non-uniform thickness in different regions. The non-uniform thickness of the DSL structure may be problematic with regard to subsequent processing steps.

By way of example, the non-uniformity in thickness of the DSL structure may cause problems during subsequent BEOL processing when etching contact via holes through the different regions (overlapped and non-overlapped regions) of the DSL structure to form contacts to underlying polysilicon contact regions (13), (13') and (17). In some conventional techniques, a reactive ion etch (RIE) process is used to concurrently etch openings in the DSL layers to expose the metal silicide regions (13), (13') and (17) in both the overlapped region (105) and non-overlapped regions of the DSL layers. To accommodate for the non-uniform thickness of the DSL layers, an over-etch RIE process is performed to ensure that a contact opening is sufficiently formed in the overlapped region (105) to expose the underlying metal contact (13'). Such over-etching, however, can cause damage to and/or erosion of the metal silicide regions (13) and (17) in the non-overlapping regions of the DSL structure which are first exposed and remain exposed during over etching of via contacts in the overlapped region (105) to sufficiently expose the silicide contacts (13'). In some instances, severe over etching can result in defects such as punch through the silicide contact layers (13) and (17) or unwanted residual material, all of which causing higher resistance contact interfaces between device contacts and the metal plugs subsequently formed in the contact holes during later stages of BEOL fabrication.

SUMMARY OF THE INVENTION

Exemplary embodiments of the invention generally include semiconductors fabrication techniques to form non-overlapping, self-aligned, dual stress liner semiconductor devices. In one exemplary embodiment, a method is provided for forming a self-aligned, dual stress liner for complementary metal oxide semiconductor (CMOS) devices beginning at an intermediate stage of CMOS fabrication where a semiconductor substrate is formed having first and second device regions formed on an active surface of the semiconductor substrate and separated by an isolation region, the first and second device regions including respective first type and second type transistor devices. A first stress liner layer is formed over the first and second device regions conformably covering the first and second type transistor devices and a first insulating layer is formed over the first stress liner layer.

The first insulating layer and first stress liner layer are patterned to remove those portions of the first insulating layer and first stress liner layer disposed over the second device region and thereby form a step structure defined by remaining portions of the first stress liner layer and fist insulation layer stacked over the first device region. The step structure comprise a substantially vertical sidewall disposed over the isolation region, which is defined by a patterned sidewall of the first insulating layer and a patterned sidewall of the first stress liner layer.

A second stress liner layer is then formed over the first and second device regions to conformally cover the second type transistors in the second device region and cover an upper surface and the vertical sidewall of the step structure. A portion of the second stress liner layer that abuts the patterned sidewall of the first insulating layer defines a sacrificial vertical pillar and a portion of the second stress liner layer that abuts the patterned sidewall of the first stress liner layer defines a gapless interface between the first and second stress liner layers. A second insulating layer is then formed over the first and second device regions covering the second stress liner layer. Thereafter, the semiconductor substrate surface is planarized down to a level above the first and second transistor devices that is sufficient to remove the sacrificial vertical pillar overlying the gapless interface between the first and second stress liner layers disposed in the isolation region.

In another exemplary embodiment of the invention, a method is provided for forming a self-aligned, dual stress liner for complementary metal oxide semiconductor (CMOS) devices beginning at an intermediate stage of CMOS fabrication where a semiconductor substrate is formed having first and second device regions formed on an active surface of the semiconductor substrate and separated by an isolation region, the first and second device regions including respective first type and second type transistor devices having polyconductor gate electrode and the isolation region comprising a polyconductor line formed thereon. A first stress liner layer of silicon nitride is formed over the first and second device regions conformably covering the first and second type transistor devices and a first insulating layer of silicon oxide is formed over the first stress liner layer.

The first insulating layer is then photo-lithographically patterned to expose a portion of the first stress liner layer over the second device region and an adjacent portion of the isolation region. The patterned first insulating layer forms a step structure comprising a substantially vertical sidewall disposed over the isolation region. The exposed portion of the first stress liner layer in the second device region is then anisotropically etched using the patterned first insulating layer of silicon oxide as an etch mask to form a patterned first stress liner layer having a patterned sidewall aligned to the vertical sidewall of the patterned first insulating layer.

A second stress liner layer of silicon nitride is then formed which conformally covers the second type transistors in the second device region and an upper surface and the patterned sidewalls of the patterned first insulating layer and first stress liner layer such that a portion of the second stress liner layer that abuts the patterned sidewall of the first stress liner layer defines a gapless interface between the first and second stress liner layers. A second insulating layer of silicon oxide is then formed over the first and second device regions covering the second stress liner layer. The semiconductor substrate surface is then planarized down to a level to expose portions of the first and second stress liner layers atop the polyconductor gate electrodes in the first and second device regions and the polyconductor line in the isolation region. A third insulating layer of silicon oxide is then formed over the planarized semiconductor substrate surface covering the exposed portions of the first and second stress liner layers atop the polyconductor gate electrode and the polyconductor line.

In another embodiment of the invention, a dual stress liner (DSL) complementary metal oxide semiconductor (CMOS) device is provided, which comprises;

a semiconductor substrate comprising first and second device regions formed on an active surface of the semiconductor substrate and separated by an isolation region, the first and second device regions including respective first type and second type transistor devices having polyconductor gate electrode and the isolation region comprising a polyconductor line formed thereon;

a self aligned DSL structure comprising a first stress liner layer conformally covering the first type transistor devices in the first device region and a portion of the polyconductor line in the isolation region and a second stress liner layer conformally covering the second type transistor devices in the second device region and a portion of the polyconductor line in the isolation region, a first layer of insulating material disposed in gaps between adjacent polyconductor gate electrodes in the first device region and in gaps between polyconductor gate electrodes in the first device region and the polyconductor line in the isolation region;

a second layer of insulating material disposed in gaps between adjacent polyconductor gate electrodes in the second device region and in gaps between polyconductor gate electrodes in the second device region and the polyconductor line in the isolation region; and a third layer of insulating material formed over the substrate surface covering the first and second insulating materials in the gaps and covering the portions of the first and second stress liner layers atop the polyconductor gate electrodes in the first and second device regions and the polyconductor line in the isolation region between polyconductor gate electrodes and polyconductor line.

In other exemplary embodiments of the invention, the first and second stress liner layers may be formed having substantially the same thickness. The first and second stress liner layers may be formed of silicon nitride while the first, second and third layers of insulating material are formed of silicon oxide. The first and second insulating layers may be formed of a thermal CVD silicon oxide (to meet gap filling critical requirements) and wherein the third insulating layer is formed of a plasma CVD silicon oxide (to meet density and moisture resistance critical requirements).

In other exemplary embodiments, the first stress liner layer may be formed of a tensile stressed silicon nitride layer while the first layer of insulating material may be formed of a tensile stressed silicon oxide. The second stress liner layer may be formed of a compressive stressed silicon nitride layer while the second layer of insulating material is formed of a compressive stressed silicon oxide. The third layer of insulating layer may be formed of a compressive or tensile stressed plasma CVD silicon oxide.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
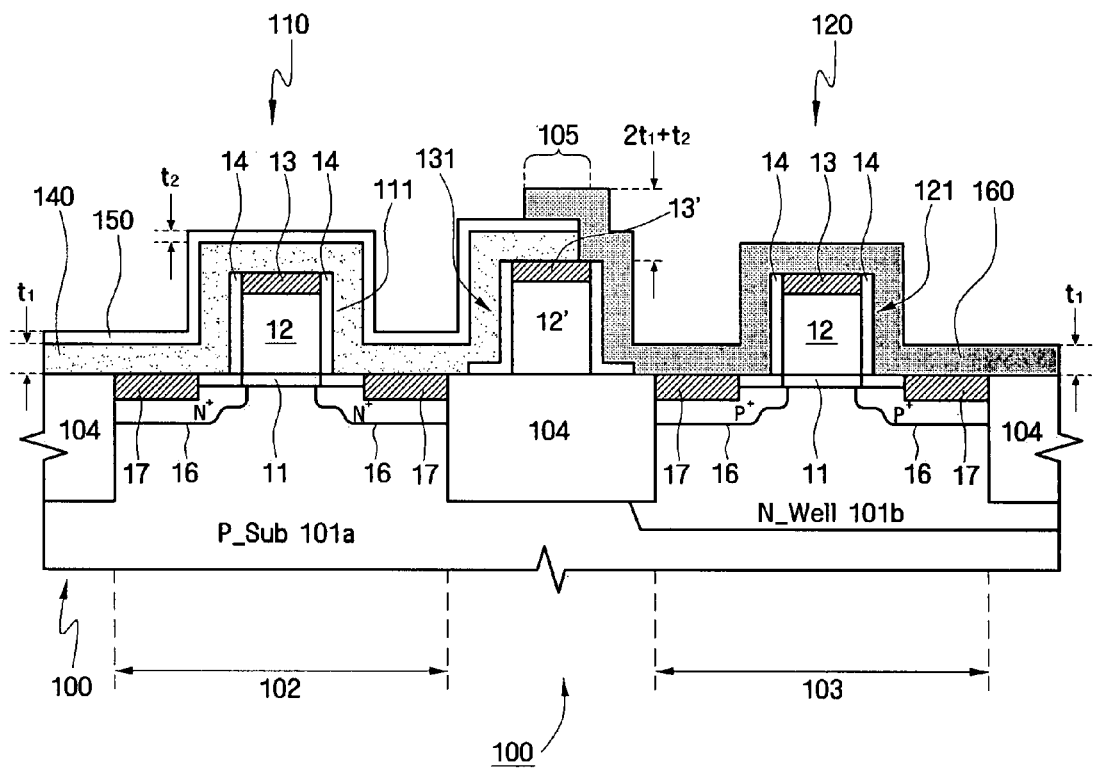
FIG. 1 is a cross-sectional schematic view of a CMOS device having a conventional framework with overlapping dual stress liner layers.

Exemplary embodiments of the invention will now be described more fully with reference to the schematic illustrations in the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals that are used throughout the drawings are used to denote elements that are the same or similar or which have the same or similar functions.

Figure 2A:
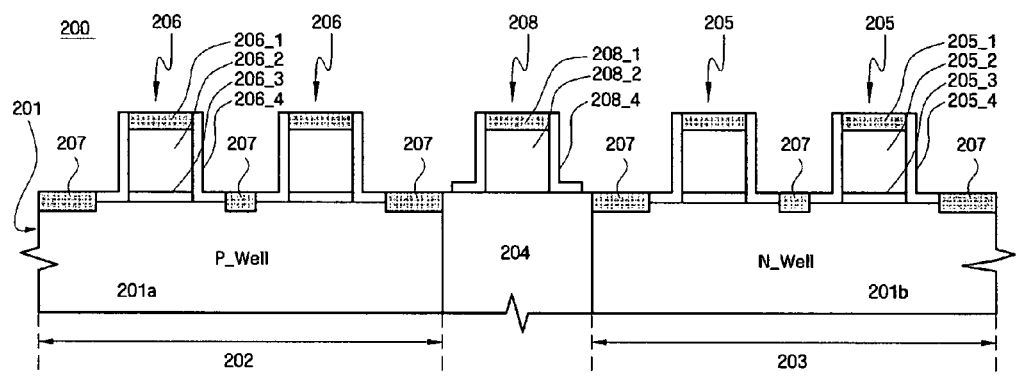
FIG. 2A through 2J schematically illustrate an exemplary process flow for fabricating a self-aligned, dual stress liner semiconductor device according to an exemplary embodiment of the invention.

FIG. 2A through 2J schematically illustrate an exemplary process flow for fabricating a self-aligned, dual stress liner semiconductor device according to an exemplary embodiment of the invention. FIG. 2A is a cross-sectional schematic view of a semiconductor device (200) at an intermediate FEOL stage of a CMOS fabrication process following a salicidation process. In particular, the semiconductor device (200) includes a substrate (201) having first and second active device regions (202) and (203) separated by an isolation region (204). A plurality of NMOS transistor devices (206) and PMOS transistor devices (205) are formed over respective active regions (202) and (203). Moreover, a polyconductor structure (208) is formed over the isolation region (204).

The NMOS transistor devices (206) each comprise a polysilicon (poly-Si) gate electrode formed of stacked layers including a metal silicide layer (206-1), a polysilicon layer (206-2), and a dielectric layer (206-3), and thin L-shaped sidewall insulating spacer layers (206-4) formed on the sidewalls of the gate electrodes and a portion of the surface of the active silicon region (202) adjacent the sidewalls. Similarly, the PMOS transistor devices (205) each comprise a polysilicon (poly-Si) gate electrode formed of stacked layers including a metal silicide layer (205-1), a polysilicon layer (205-2), and a dielectric layer (205-3), and thin L-shaped sidewall insulating spacer layers (205-4) formed on the sidewalls of the gate electrodes and a portion of the surface of the active silicon region (203) adjacent the sidewalls. The transistor devices (205) and (206) also include source/drain regions having metal silicide contact regions (207).

The polyconductor structure (208) comprises a metal silicide layer (208-1) and a polysilicon layer (208-2) and thin sidewall spacers (208-4) similar to the gate structures of the complementary transistors (205) and (206). The polyconductor structure (208) may be part of an electrical interconnection that is formed simultaneously and integrally with the gate structures of the complementary transistors (205) and (206), which serves to connect the gate electrodes of adjacent complementary transistor pairs (205) and (206), for example. The intermediate semiconductor device structure (200) depicted in FIG. 2A can be fabricated using known FEOL CMOS fabrication techniques, the details of which are not necessary for an understanding of the claimed inventions.

Figure 2B:
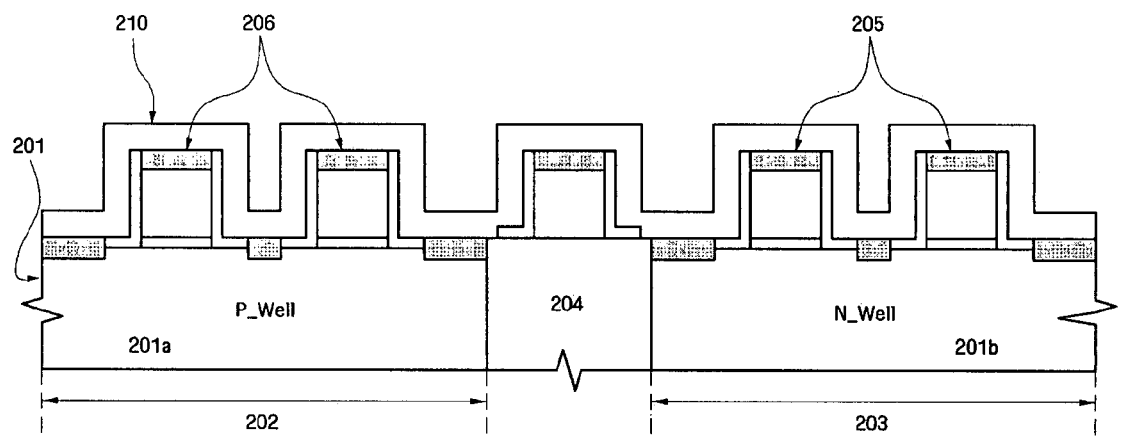

Referring to FIG. 2B, a first stress liner layer (210) is formed over the first and second device regions (202) and (203) to conformally cover the transistors (205) and (206) and the polyconductor structure (208) in the isolation region (204). In one exemplary embodiment of the invention, the first stress liner layer (210) is a tensile stress liner layer that is formed by conformally depositing any suitable stress liner material using known techniques to impart tensile stress. For example, the stress liner layer (210) may be a silicon nitride (SiN) film that is deposited using a plasma enhanced chemical vapor deposition (PECVD) process to obtain a specified intrinsic tensile stress according to factors such as gas mixture, the deposition rate, temperature and degree of ion bombardment. The first stress liner layer (210) may be formed to have an exemplary thickness of about 600 angstroms.

Figure 2C:
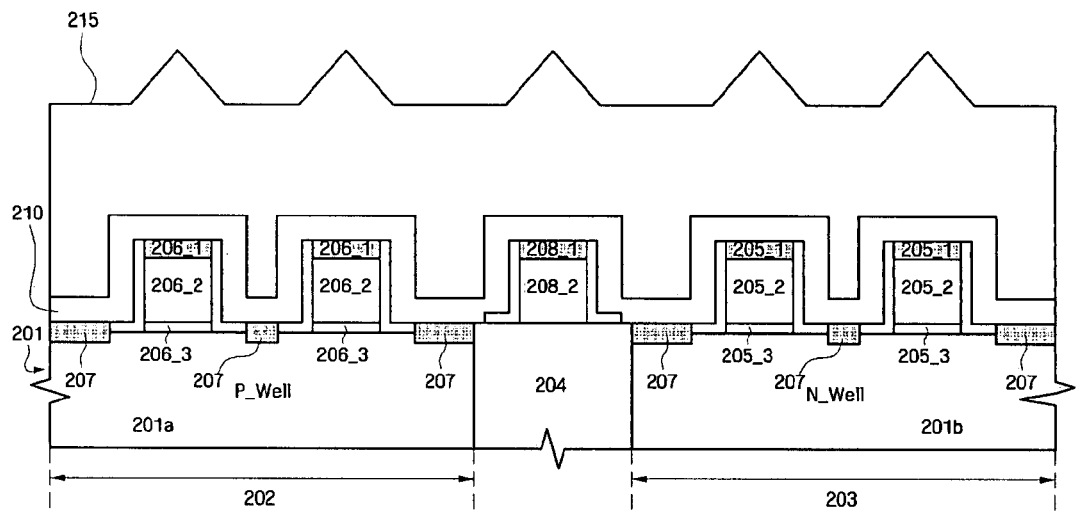

Next, as illustrated in FIG. 2C, a first insulating layer (215) is formed over the first and second device regions (202), (203) covering the first stress liner layer (210). The first insulating layer (215) may foe an oxide, such as a doped or undoped silicon oxide material, that is deposited using a thermal or plasma-assisted CVD (chemical vapor deposition). As explained below, a portion of the insulating layer (215) material disposed in the gaps between the gate stacks of the N type transistors (206) and polyconductor (208) in the Nfet device region (202) form part of a premetal dielectric (PMD) layer, where desired physical and chemical properties of the deposited film (215) pertaining to desired stress, conformality, density, moisture resistance, and/or gap-fill properties, etc., for a given application can be achieved based on the type of materials and CVD deposition process/parameter that are employed to form the first insulating layer (215).

Figure 2D:
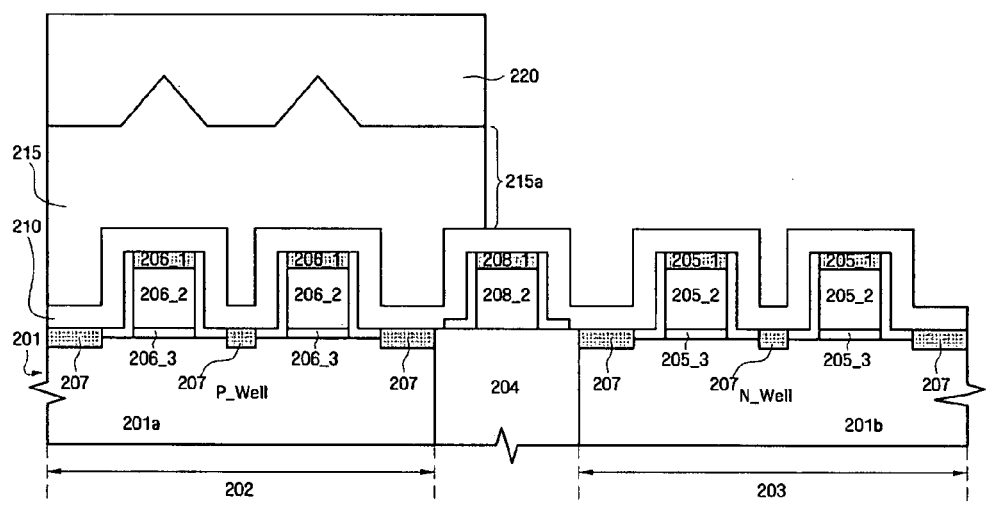

Referring to FIG. 2D, following formation of the first insulating layer (215) of oxide, a photolithographic patterning process is performed to form a photoresist etch mask (220) exposes a portion of the first insulating layer (215) overlaying the PFET region (203) and a portion of the isolation region (204) adjacent the PFET region (203). The photoresist maker (220) is used as an etch mask during an anisotropic etch process in which the exposed portions of the first insulation layer (215) is etched away to exposed the underlying portion of the first stress liner layer (210) covering the PFET region (203) and a portion of the polyconductor (208) in the isolation region (204). The first insulating layer (215) of oxide may be etched using any conventional etch process, such as an anisotropic dry oxide etch process (e.g., reactive ion etching) having a suitable etch chemistry to etch the oxide layer (215) selective to the material (e.g., nitride) of the first stress liner layer (210). The oxide etch process results in the formation of a patterned sidewall (215a) of the first insulating layer (215) forming a vertical step structure over the polyconductor structure (208) in the isolation region (204).

Figure 2E:
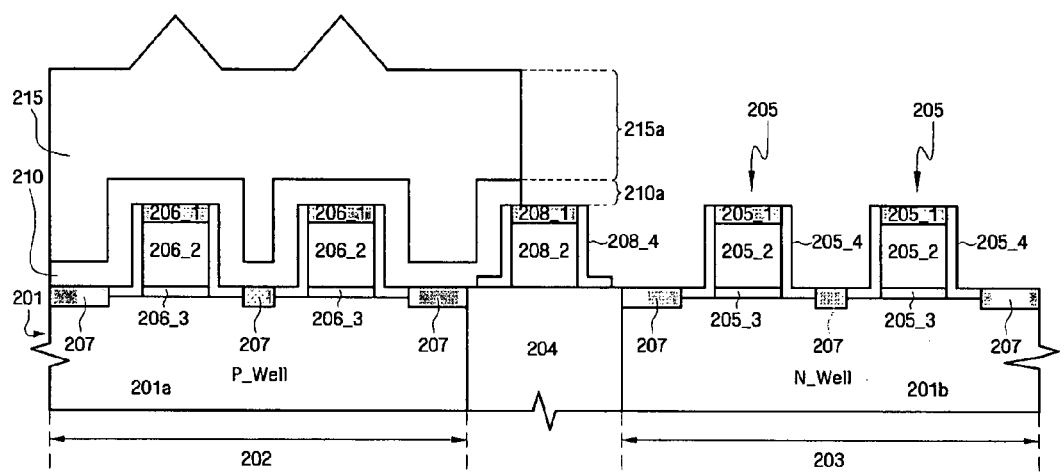

Following the oxide etch, the photoresist mask (220) is removed using an ashing process, for example. The remaining portion of the first insulating layer (215) over the device region (202) and portion of the isolation region (204) is then used as an etch mask to remove the exposed portion of the first stress liner layer (210) in the PFET region (203) and isolation region (204), resulting in the intermediate structure of FIG. 2E. This etch process can be performed using a conventional etch process that is suitable for etching the nitride material of the first stress liner layer (210) selective to the oxide material of the first insulating layer (215) and oxide spacers (208-4) of polyconductor (208) and oxide spacers (205-4) of PMOS transistor devices (205). In this etch process, the salicided regions (205-1), (208-1) and 207 are used as etch stops. As shown in FIG. 2E, a patterned sidewall (210a) of the first stress liner layer (210) is aligned to the patterned sidewall (215a) of the first insulation layer (215) forming a vertical step structure over the polyconductor (208) in the isolation region (204) between the device regions (202) and (203).

Figure 2F:
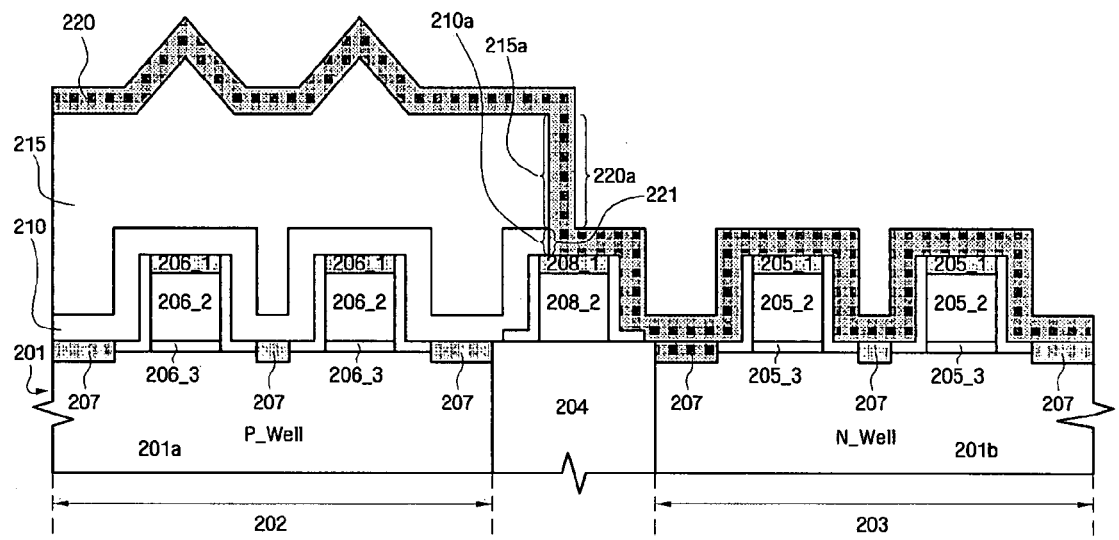

Referring to FIG. 2F, a second stress liner layer (220) is formed over the entire surface of the substrate conformally covering the first insulating layer (215) and the PMOS transistor devices (205) in the device region (203). In one exemplary embodiment of the invention, the second stress liner layer (220) is a compressive stress liner layer that is formed by conformally depositing any suitable stress liner material using known techniques to impart tensile stress. For example, the second stress liner layer (220) may be a silicon nitride (SiN) film that is deposited using a plasma enhanced chemical vapor deposition (PECVD) process to obtain a specified intrinsic compressive stress according to factors such as gas mixture, the deposition rate, temperature and degree of ion bombardment. The second stress liner layer (220) may be formed to have the same thickness as the first stress liner layer (210), e.g., about 600 angstroms, As illustrated in FIG. 2F, the second stress liner layer (220) is conformally deposited to cover the patterned sidewalls (210a) and (215a) of the respective first stress liner layer (210) and first insulating layer (215) thereby defining a vertical pillar (220a) of second stress liner layer material which extends along the etched sidewall (215a) of the first insulating layer (215). The second stress liner layer (220) abuts the patterned sidewall (210a) of the patterned first stress liner layer (210) to define gapless, non-overlapped interface (221) between the first and second stress liner layers (210) and (220) above the polyconductor structure (208) in the isolation region (204).

Figure 2G:
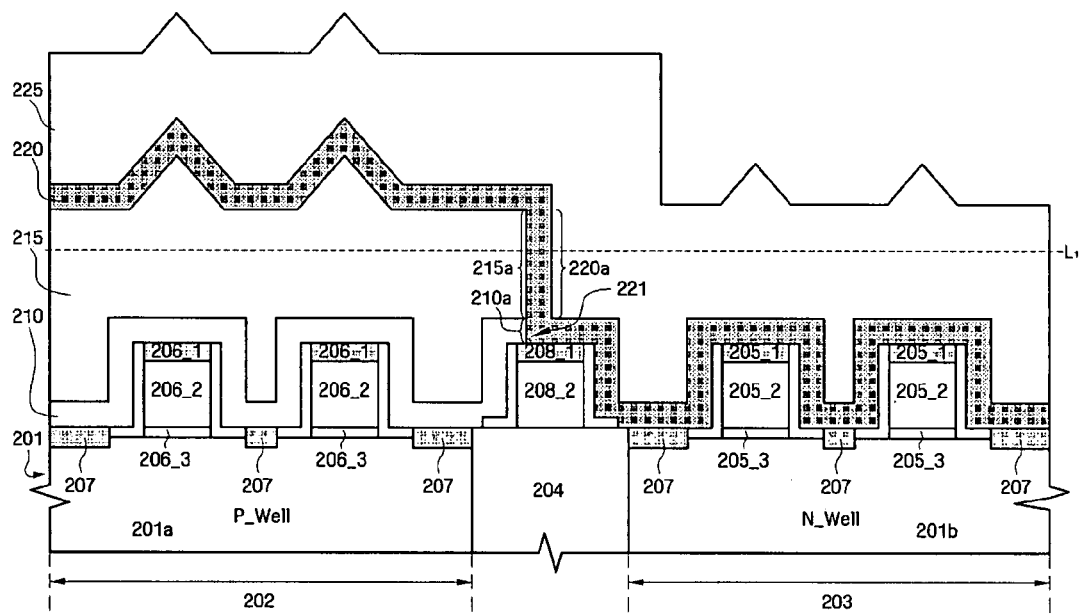

Next, referring to FIG. 2G, a second insulating layer (225) is formed over the first and second device regions (202), (203) covering the second stress liner layer (220). The second insulating layer (225) may be an oxide, such as a doped or undoped silicon oxide material, that is deposited using a thermal or plasma-assisted CVD (chemical vapor deposition). As explained below, a portion of the second insulating layer (225) material disposed in the gaps between the gate stacks of the P type transistors (205) and polyconductor (208) in the PFET device region (203) forms part of the PMD layer, where desired physical and chemical properties of the deposited film (225) pertaining to stress, conformality, density, moisture resistance, and/or gap-fill properties, etc., can be achieved for a given application based on the type of materials and CVD deposition process/parameter that are employed to form the second insulating layer (225).

Following deposition of the second insulating layer (225), the entire surface of the substrate of the intermediate structure depicted in FIG. 2G is planarized so that the first and second insulating layers (215) and (225) are recessed to a level L1 below the portion of second stress liner layer (220) overlaying the first insulating layer (215) in the device region (202). This planarization process results in the intermediate structure depicted in FIG. 2H. In one exemplary embodiment, planarization may be performed using a non-selective CMP (chemical mechanical polishing) process so as to remove the oxide materials forming the first and second insulating layers (215), (225) and the nitride material forming the second stress liner layer (220).

The non-selective CMP is performed to planarize the surface at the level L1 above the portions of the first and second stress liner layers (210) and (220) overlaying the silicide layers (205_1) and (206_1) of the gate stacks of transistors devices (205) and (206) in device regions (203) and (202), respectively and the silicide layer (208_1) of the polyconductor (208) in the isolation region. As a result of this process, a portion (220a') of the vertical pillar (220a) (formed by the second stress liner layer (220) abutting the patterned sidewall (215a) of the first insulating layer (215) is disposed between and isolates the remaining portions of the first and second insulating layers (215) and (225) overlaying respective device regions (202) and (203), such as depicted in FIG. 2H.

Figure 2H:
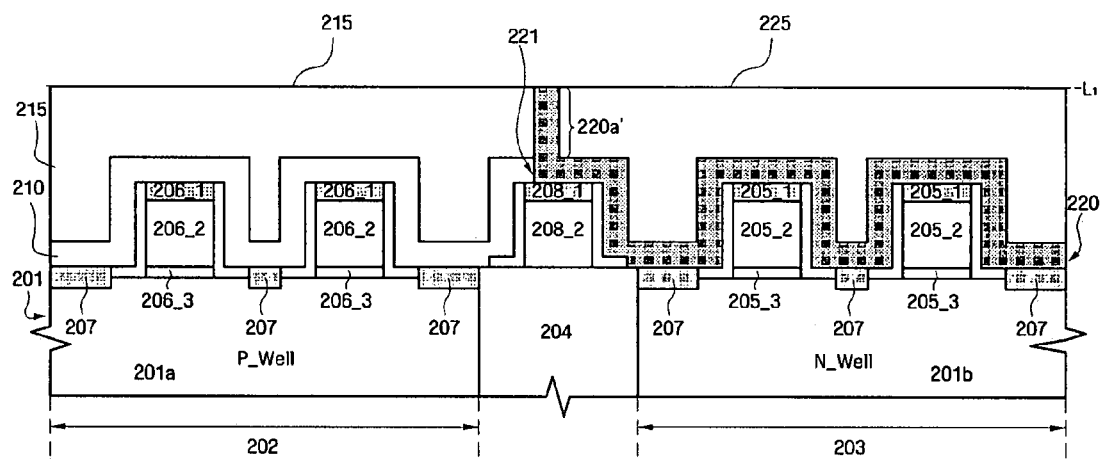
Figure 2I:
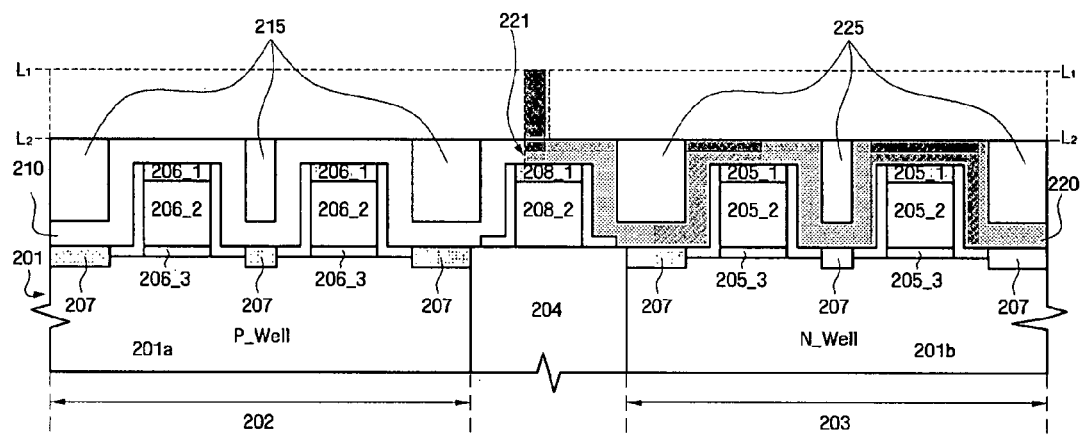

Next, the structure in FIG. 2H is subjected to a second CMP process to planarize the surface of the substrate down to level L2 at the upper surface portions of the first and second stress liner layers (210) and (220) on the silicide layers (205-1) and (206-1) of the transistor device (205) and (206) in device regions (203) and (202) and the silicide layer (208_1) of the polyconductor (208) in the isolation region, resulting in the intermediate structure depicted in FIG. 2I. This process may be performed using a selective CMP process to remove the oxide materials forming the first and second insulating layers (215) and (225) selective to the nitride materials forming the first and second stress liner layers (210) and (220), which are used as etch stops. Despite the selective oxide CMP removal, the remaining portion (220a') of the vertical pillar (220a) of nitride material in FIG. 2H can be effectively removed during such selective CMP process.

In the resulting structure depicted in FIG. 2I, the vertical pillar (220a') is removed down to the level L2 so as to define a gapless vertical interface (221) between abutting end portions of the first and second stress liner layers (210) and (220) over the polyconductor (208) in the isolation region (204).

This process results in the formation of a DSL structure having a self-aligned gapless interface that is formed between the first and second stress liner layers (210) and (220) without the need for a second lithographic patterning step as in the conventional process discussed in the background section above.

Figure 2J:
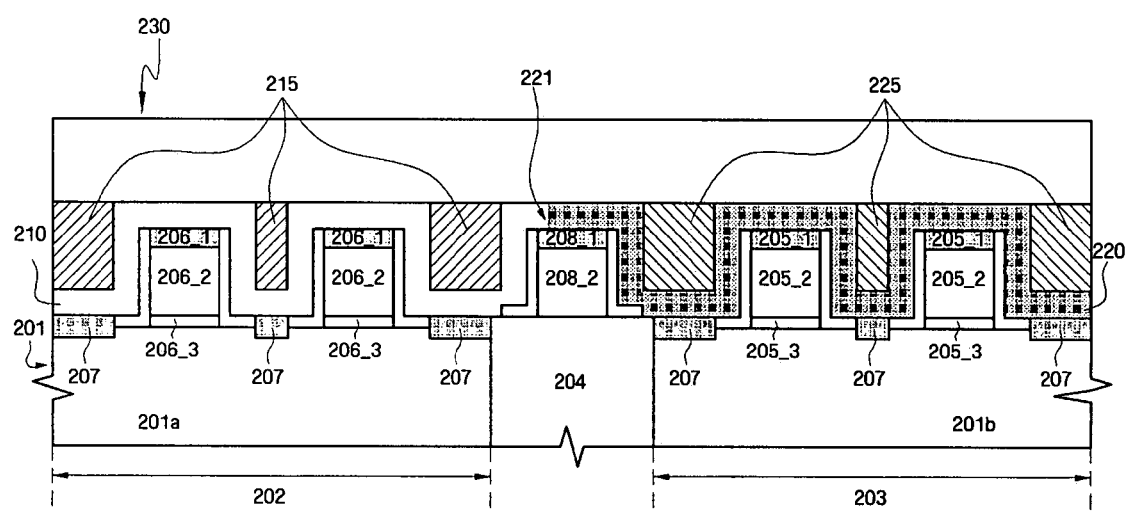

Following CMP, a third insulating layer (230) is formed over the substrate surface covering the first and second device regions (202) and (203), resulting in the structure depicted in FIG. 2J. Since remaining first and second insulating layers (215) and (225) between the gate electrode of the transistors (206) and (205) in regions (202) and (203) are formed of oxide materials, the third insulating layer (230) of oxide may be directly deposited, where the various oxide materials (215), (225) and (230) together form the PMD layer, which is thereafter subjected to BEOL processing to form metal contact plugs through the PMD layer at certain location to contact desired silicide layers ((205_1), (206_1), 208_1) and/or (207).

It is to be appreciated that the exemplary process described with reference to FIGS. 2A~2J allows for the formation of a self-aligned, non-overlapping and gapless interface between dual stress liner layers without the need for a second lithographic patterning step for removing the portion of the second stress liner layer (220) (compressive nitride layer) over the NFET device region (202). As such, potential misalignment errors, which may arise when aligning lithographic levels to previous levels to form conventional non-overlapped DSL structures are avoided. Moreover, exemplary methods described herein obviate the need to form overlapping stress liner transitions to ensure a gap free transition between two stress liner layers, such as in conventional methods discussed above which overlapped liner layers can lead to defect mechanisms in subsequent processing.

It is to be further appreciated the exemplary processes discussed above involve processing steps in which the pre-metal dielectric (PMD) layer is incrementally formed in various stages, which advantageously allows the PMD layer to be formed using different oxide materials and/or deposition processes for optimizing performance. In particular, in the resulting structure depicted in FIG. 2J, the PMD layer is a composite insulation layer comprising portions of the first insulating layer (215) disposed in the gaps between the gate electrodes of the NMOS transistor devices (206) in the first device region (202), portions of the second insulation layer (225) disposed in the gaps between the gate electrodes of the PMOS transistor devices (205) in the device region (203), and the third insulating layer (230) that overlays the first and second device regions (202) and (203). In this regard, different insulating layer materials and/or deposition processes can be used to form the various layers (215), (225), and (230) so as to achieve desired physical and chemical properties with regard to tuning of induced stress, conformality, density, moisture resistance, and gap-fill properties and thus, optimize device performance and achieve certain electrical characteristics.

In general, the various insulating materials for layers (215), (225) and (230) are preferably formed of CVD oxide materials such as doped or undoped silicon oxides so as to have etch selectivity with respect to the materials (silicon nitride) forming the first and second stress liner layers (210) and (220). The various silicon oxides may include undoped silicon oxide (USG) or doped silicon oxides such phosphorus-doped silicon oxide (PSG), and boron/phosphorus-doped silicon oxide (BPSG). These various silicon oxides can be formed by thermal CVD processes or plasma assisted CVD processes using silane or organosilicon compounds, such as TEOS tetraethylorthosilicate, as a silicon source. Thermal CVD process (non-plasma processed) include APCVD (atmospheric pressure CVD), SACVD (sub atmospheric pressure CVD), and LPCVD (low pressure CVD) processes. Plasma assisted CVD processes include PECVD (plasma enhanced CVD) and HDP (high density plasma) CVD processes, for example. For conventional thermal CVD processing, physical, and chemical properties of the deposited silicon oxide can be altered by changing the composition and/or type of reactive species. With plasma-assisted CVD processes, the physical and chemical properties of deposited silicon oxide can be altered by varying deposition parameters such as temperature, RF power, pressure, reactant gas mixture ratio, and types of reactant.

When forming the first and second insulating layers (215) and (225), a critical requirement that must be met may be the filling of the gaps between the polygate electrodes in the various regions (202), (203), and (204) without void formation. Typically, for sub-micron design rules and beyond, thermal CVD processes such as LPCVD and SACVD can be used because of their high-aspect-ratio fill capabilities as compared to plasma assisted CVD processes. For instance, thermal CVD silicon oxide films deposited with TEOS typically provide good step coverage and conformality for gap filling purposes.

In contrast, when forming the silicon oxide layer (230), step coverage and conformality is not necessarily a critical requirement as the silicon oxide layer (230) is being deposited over a planarized surface. Instead, hardness and/or moisture resistance and self-planarization may critical requirement for formation of the insulating layer (230). In this regard, a HDP CVD process may foe used to form silicon oxide layer (230) which achieves a more planarized layer as deposited due to a characteristic of HDP CVD providing a "bottom-up" deposition from by virtue of a simultaneous deposition and etching processed characteristic of HDP CVD. Moreover, silicon oxide files that are deposited using a HDP CVD process are typically more dense/hard and moisture resistant that silicon oxide films that are deposited using thermal CVD processes.

Moreover, depending on the application, the various silicon oxide layers (215), (225) and (230) can be deposited having certain intrinsic stresses where the stresses of the silicon oxide films can be made to vary from tensile to compressive depending on deposition processes and conditions. For instance, the silicon oxide material of insulation layer (215) can be formed to have tensile stress to augment or otherwise tune the tensile stress imparted by the first stress liner layer (210) over the NFET device region (202) in FIG. 2J. Similarly, the silicon oxide material of the insulation layer (225) can be formed to have compressive stress to augment or otherwise tune the tensile stress imparted by the second stress liner layer (225) over the PFET device region (203). Moreover, the silicon oxide material of the third insulation layer (230) can be formed to have tensile or compressive stress so as to counteract an effective tensile or compressive stress imparted by the first and second stress liner layers (210) and (220) (together with the optional tensile/compressive stress formed silicon oxide layers (215) and (225)) so as to counteract overall effective tensile/compressive stress forces and prevent substrate warpage, for example.

In summary, the various silicon oxide materials (215), (225) and (230) forming the PMD layer can be formed of the same or different materials and/or CVD processes to achieve desired performance. As noted above, the insulating layers (215) and (225) can be formed with CVD silicon oxides that have good gap filling properties to effectively fill the gaps between the gate electrodes and/or be formed with desired intrinsic stresses (tensile/compressive) so as to enhance the effects of the DSL structures. Thermal CVD silicon oxides that provide sufficient gap filling properties for sub-micron design rules typically do not provide adequate hardness or moisture resistance needed to protect the underlying active components from oxidation or subsequent etching environments. In this regard, the third insulating layer (230) may be formed with an HDP CVD silicon oxide to provide planarity, density, and moisture resistance properties desired for the PMD, where gap filling characteristics are not critical.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for forming a self-aligned, dual stress liner for complementary metal oxide semiconductor (CMOS) devices, the method comprising:

providing a semiconductor substrate comprising first and second device regions formed on an active surface of the semiconductor substrate and separated by an isolation region, the first and second device regions including respective first type and second type transistor devices;

forming a first stress liner layer over the first and second device regions conformally covering the first and second type transistor devices;

forming a first insulating layer over the first stress liner layer;

patterning the first insulating layer and first stress liner layer to remove portions of the first insulating layer and first stress liner layer over the second device region and thereby form a step structure defined by remaining portions of the first stress liner layer and first insulation layer stacked over the first device region, wherein the step structure comprise a substantially vertical sidewall disposed over the isolation region, which is defined by a patterned sidewall of the first insulating layer and a patterned sidewall of the first stress liner layer;

forming a second stress liner layer over the first and second device regions to conformally cover the second type transistors in the second device region and cover an upper surface and the vertical sidewall of the step structure, wherein a portion of the second stress liner layer that abuts the patterned sidewall of the first insulating layer defines a sacrificial vertical pillar and wherein a portion of the second stress liner layer that abuts the patterned sidewall of the first stress liner layer defines a gapless interface between the first and second stress liner layers;

forming a second insulating layer over the first and second device regions covering the second stress liner layer, wherein the second insulating layer does not contact the first insulating layer;

planarizing the semiconductor substrate surface to a level above the first and second transistor devices that is sufficient to remove the sacrificial vertical pillar overlying the gapless interface between the first and second stress liner layers disposed in the isolation region, wherein planarizing the semiconductor substrate surface comprises:

performing an unselective chemical mechanical polishing (CMP) process to recess the first and second insulating layers and the sacrificial vertical pillar to a level below a portion of the second stress liner layer overlaying the upper surface of the step structure, such that the height of the first and second insulating layers over the semiconductor substrate is uniform across the first and second device regions.

2. The method of claim 1, wherein patterning the first insulating layer and first stress liner layer comprises:

photolithographically patterning the first insulating layer using a photoresist mask to expose an underlying portion of the first stress liner layer; and etching the exposed underlying portion of the first stress liner layer using the patterned first insulating layer as an etch mask.

3. The method of claim 1, wherein planarizing the semiconductor substrate surface further comprises:

performing a selective CMP process to further recess the first and second insulating layers and sacrificial vertical pillar down to a level reaching portions of the first and second stress liner layers disposed on upper surfaces of the gate electrodes of the first and second type transistor devices, wherein the selective CMP process is performed to remove the first and second insulating layers selective to the first and second stress liner layers, such that the height over the semiconductor substrate of the remaining portions of the first and second insulating layers respectively between the first type and second type transistor devices is uniform across the first and second device regions.

4. The method of claim 3, wherein the remaining portions of the first and second insulating layers are planarized to the same height over the semiconductor substrate.

5. The method of claim 1, wherein the first and second stress liner layers are formed of silicon nitride, and wherein the first and second insulating layers are formed of silicon oxide.

6. The method of claim 1, wherein the first and second stress liner layers are formed having substantially the same thickness.

7. The method of claim 1, further comprising forming a third insulating layer following the planarizing process.

8. The method of claim 7, wherein the first, second and third insulating layers are formed of silicon oxide.

9. The method of claim 8, wherein the first and second insulating layers are formed of a thermal CVD silicon oxide, and wherein the third insulating layer is formed of a plasma CVD silicon oxide.

10. The method of claim 8, wherein the first stress liner layer is formed of a tensile stressed silicon nitride layer, and wherein the first insulating layer is formed of a tensile stressed silicon oxide.

11. The method of claim 8, wherein the second stress liner layer is formed of a compressive stressed silicon nitride layer and wherein the second insulating layer is formed of a compressive stressed silicon oxide.

12. The method of claim 8, wherein the third insulating layer is formed of a compressive or tensile stressed plasma CVD silicon oxide.

13. The method of claim 1, wherein the first and second insulating layers are planarized to the same height over the semiconductor substrate.

* * * * *

UNITED STATES PATENT AND TRADEMARK OFFICE
CERTIFICATE OF CORRECTION

| | | |
|---|---|---|
| PATENT NO. | : 7,911,001 B2 | Page 1 of 1 |
| APPLICATION NO. | : 11/778045 | |
| DATED | : March 22, 2011 | |
| INVENTOR(S) | : Kyoung Woo Lee et al. | |

It is certified that error appears in the above-identified patent and that said Letters Patent is hereby corrected as shown below:

Title page

Item (73) Assignee: Should read as follows, -- Samsung Electronics Co., Ltd. and International Business Machines Corporation --.

Signed and Sealed this
Eighteenth Day of August, 2015

Michelle K. Lee
*Director of the United States Patent and Trademark Office*